United States Patent [19]

Francis et al.

[11] Patent Number: 4,742,267
[45] Date of Patent: May 3, 1988

[54] CATHODE RAY TUBES PROVIDED WITH FLEXIBLE CONNECTORS

[75] Inventors: Leslie H. Francis, Horley; Robert J. Baker, Lower Kingswood, both of England

[73] Assignee: U.S. Philips Corp., New York, N.Y.

[21] Appl. No.: 894,182

[22] Filed: Aug. 7, 1986

[30] Foreign Application Priority Data

Aug. 30, 1985 [GB] United Kingdom ............... 8521580

[51] Int. Cl.$^4$ .................... H01J 29/90; H01B 7/00
[52] U.S. Cl. .................... 313/477 HC; 313/477 R; 174/50.63; 174/17.08; 174/110 N; 174/117 F
[58] Field of Search .............. 313/477 R, 477 HC; 174/50.52, 50.53, 50.6, 50.64, 110 N, 114 R, 117 F, 117 FF, 120 R, 120 SR, 120 C

[56] References Cited

U.S. PATENT DOCUMENTS

| | | | |
|---|---|---|---|
| 4,075,420 | 2/1978 | Walton | 174/110 N X |
| 4,268,712 | 5/1981 | Overall | 313/477 R X |
| 4,492,815 | 1/1985 | Maros | 174/117 F X |

*Primary Examiner*—David K. Moore
*Assistant Examiner*—K. Wieder
*Attorney, Agent, or Firm*—Norman N. Spain

[57] ABSTRACT

A cathode ray tube has a thin flexible circuit (48) comprising one or more films of polyimide with a plurality of conductive tracks deposited directly thereon for establishing electrical connection between a multi-pin lead through (45) passing through the wall of the tube's envelope (31) and terminals of electrically operable components within the envelope, e.g. electron gun (35) and beam-deflection electrodes (36,39 and 40). A number of track-carrying films may be stacked together to form a laminate structure. Such a flexible circuit avoids outgassing problems and, being thin and flexible, occupies minimal space and is easily routed around internal components to ease assembly.

11 Claims, 2 Drawing Sheets

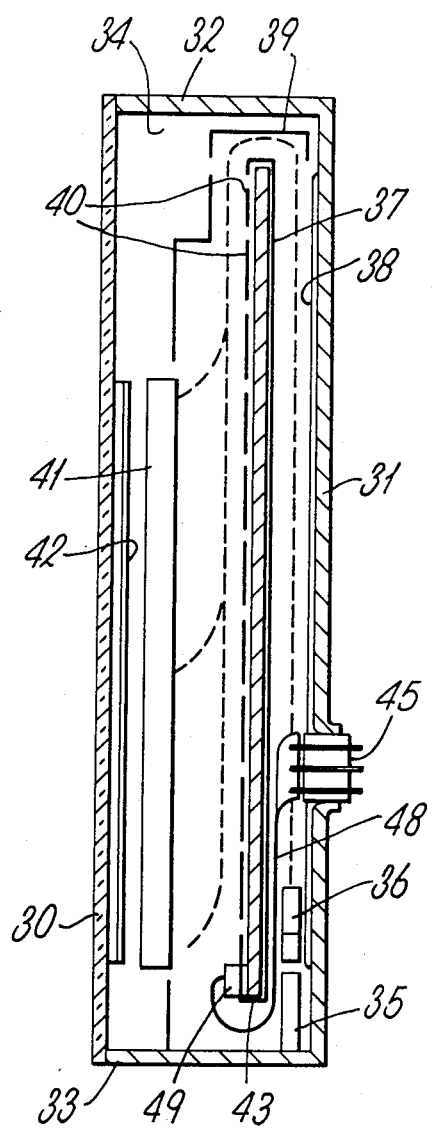

CATHODE RAY TUBES PROVIDED WITH FLEXIBLE CONNECTORS

BACKGROUND OF THE INVENTION

This invention relates to a cathode ray tube and in particular to a cathode ray tube comprising an envelope containing electrically operable components comprising at least means for producing an electron beam within the envelope, electrical leadthrough means extending through the wall of the envelope, and conductor means extending within the envelope and electrically coupled between the leadthrough means and terminals of the electrically operable components.

An example of such a tube is described in U.K. Patent Specification No. 1598888 corresponding to U.S. Pat. No. 4,268,712. In this tube, the envelope consists of a mild steel cone to which is sealed a flat, toughened glass faceplate. In addition to an electron gun for producing an electron beam, the envelope contains also a channel plate electron multiplier and, although not specifically described, an electron beam deflection arrangement for deflecting the beam across a screen carried on the faceplate in raster fashion. Electrical interconnection between the internal, electrically operable components of the tube and the outside is established by means of a multi-pin leadthrough with circuit connectors sealed in vacuum-tight manner in the wall of the mild steel envelope. In order to connect the internal components with the multi-pin leadthrough, individual sheathed metal wires constituting conductors have been used. These wires are connected at their other ends to terminals associated with the components.

This form of interconnection is not entirely satisfactory. With the example of tube mentioned, it will be appreciated that as a large number of electrically operable components are situated within the envelope, a correspondingly large number of wires are needed to connect these components with the leadthrough, and difficulties are experienced in positioning these wires so as not to interfere with operation of the tube. In the case of compact tubes where available internal space is reduced to a minimum, the problem of arranging the wires around the structures within the envelope is even greater and makes assembly of the tube a time-consuming task.

A further consideration is that in tubes of the aforementioned type it is convenient to assemble the internal components as a sub-unit which is subsequently inserted into the metal envelope prior to sealing the faceplate. This procedure becomes impractical when using conventional wiring techniques to connect internal components to a leadthrough as the latter is located within the metal envelope and access to form the connections with the wiring is inhibited by the presence of the sub-unit.

Another important consideration with cathode ray tubes is outgassing. A large number of individual wires can significantly increase the risk of problems occurring in this respect and the choice of wire and sheathing materials is limited.

BRIEF SUMMARY OF THE INVENTION

It is an object of the present invention to provide a cathode ray tube having an improved form of conductor means which overcomes at least to some extent the aforementioned problems.

According to the present invention, there is provided a cathode ray tube comprising an envelope containing electrically operable components comprising at least means for producing an electron beam within the envelope, electrical leadthrough means extending through the wall of the envelope, and conductor means extending within the envelope and electrically coupled between the leadthrough means and terminals of the electrically operable components which is characterised in that the conductor means is a flexible circuit comprising at least one film of polyimide on which a plurality of conductive tracks are deposited.

With such a cathode ray tube, the conductor means, being flexible and thin, and thus occupying very little space in one plane, can easily be routed around the internal structure in the envelope. Further, since the conductive tracks are carried on the film rather than being separate, aseembly of the tube is greatly facilitated. The use of such conductor means enables the convenient assembly procedure involving a sub-unit as described above to be adopted without difficulty as the conductor means can be made sufficiently long to allow connection to be made without hinderance with the leadthrough means in the envelope prior to insertion of the sub-unit in the envelope. Upon the subsequent insertion of the sub-unit, the conductor means is simply folded so that the space occupied by the comparatively long conductor means is still minimal. Also, it has been found that outgassing problems are not experienced with polyimide films.

BRIEF DESCRIPTION OF THE DRAWING

In the drawing:

FIG. 2 is a diagrammatic sectional view of a second form of a cathode ray tube of the invention.

DETAILED DESCRIPTION OF THE INVENTION

Figure 1:
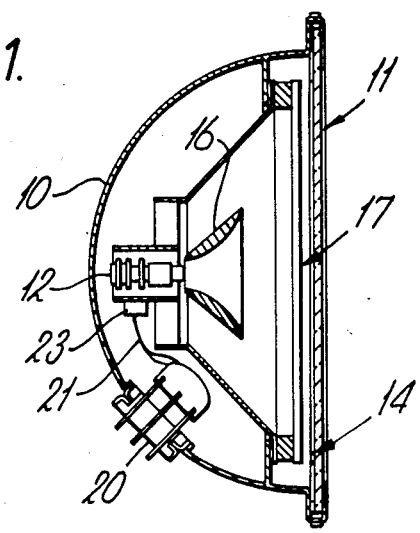
FIG. 1 is a diagrammatic sectional view of a form of a cathode ray tube of the invention.

The conductive tracks are preferably deposited directly on the polyimide film, for example, by evaporation, sputtering, or thick film techniques. It has been found that sufficiently strong bonding exists between the conductive tracks and the film by direct deposition and without using adhesive to withstand the forces applied during manipulation without conductive tracks becoming separated from the film. Direct deposition has the important advantage that, in avoiding the use of adhesive to secure the conductor tracks to the film, the conductor means, and particularly the chemically inert polyimide film, is compatible with vacuum tube requirements and, unlike most other plastic materials, presents substantially no outgassing problems even when baked at temperatures in the region of 300° C. during the operation of sealing the faceplate and the subsequent processing of the tube on a vacuum pump.

Depending on the relative disposition of the electrically-operable components in the envelope, the conductive tracks of the conductor means remote from the leadthrough means may be electrically connected between the leadthrough means and either a common terminal means to which the components are electrically coupled or two or more terminal means, the conductor means in this case branching along its length with the conductive track or tracks of each branch being associated with a respective terminal means.

The conductive track-carrying surface of the polyimide film may be covered by a further polyimide film which serves to enclose the conductive tracks.

Particularly in a cathode ray tube of the kind having a relatively large number of internal electrically-operable components, for example an electron gun, an electrostatic deflection arrangement comprising a number of individually addressable deflecting electrodes for frame and line scanning, and pehaps also an electron multiplier, the flexible circuit may comprise a plurality of films of polyimide each carrying a plurality of conductive tracks, the plurality of films being stacked together to form a laminate structure with the conductive tracks on one film being covered by an adjacent film. In this way, a large number of conductive tracks may be provided whilst the conductor means remains relatively flexible and thin. Each film may be connected at its end remote from the leadthrough means to respective terminal or a common terminal means.

In a preferred arrangement, the plurality of films are secured together by means of metal fastening elements, for example swaged eyelets, passing through the films. Such fastening means may be provided also at the end of the conductor means adjacent the leadthrough means, the fastening elements passing through and electrically connecting with one or more conductive tracks and serving as terminals for connection with respective pins of the leadthrough means. This has the advantage that connection of the conductive tracks with the leadthrough means may be accomplished readily and conveniently and without the need for any additional terminal devices.

Other forms of connection, for example, edge connectors, insulation piercing connectors, crimp-on connectors may alternatively be employed to connect the conductor means with the leadthrough means. The conductor means may be connected at its remote end(s) to one or more terminals means using similar forms of connection.

Embodiments of cathode ray tubes in accordance with the invention will now be described, by way of example, with reference to the accompanying drawings.

Referring to FIG. 1, there is shown a cathode ray tube comprising a generally hemispherical mild steel cone 10 to the open end of which is sealed in vacuum-tight manner a flat glass faceplate 11 and which together with the cone 10 defines the tube envelope. An electron gun 12 is supported on the central axis of the envelope and arranged to produce a low energy electron beam directed towards a phosphor screen 14 carried on the faceplate 11. Deflection coils 16 are arranged to scan the electron beam in raster fashion over the screen. Disposed adjacent the screen 14 and parallel thereto is a channel plate electron multiplier 17, for example as described in U.K. Patent Specification Nos. 1,401,969, 1,434,053 and 2,023,332, serving to amplify the low-voltage, low-current electron beam from the electron gun 12, the amplified beam being accelerated towards the phosphor screen 14 by a field established between the output of the multiplier and a screen electrode.

The cone 10 includes integrally formed sleeve portions into which a circular multi-pin leadthrough 20 is sealed in vacuum tight manner. Electrical connection with the internal components of the tube is established from outside the cone 10 via this multi-pin lead through 20 and electrically conductor means 21. Electrically conductor means 21 comprises a flexible circuit consisting of a insulative polyimide film on which is deposited a plurality of conductive tracks running along its length extends between the multi-pin leadthrough 20 and an in-line terminal block 23 located in the region adjacent the electron gun 12 and deflection coils 16. The conductor means 21 is thin, light and, being formed of polyimide, is readily flexible so that it is easily routed around the internal supporting structure of the envelope to the terminal block 23.

The conductive tracks at the end of the conductor means 21 adjacent the leadthrough 20 are electrically connected with respective pins thereof. The ends of the tracks remote from the leadthrough are likewise electrically connected with the terminal block 23 which, in turn, is coupled to relatively short conductors (not shown) leading to the gun 12 and deflection coils 16. Alternatively, the conductor means 21 may divide along its length so as to form two (or more) branches each having conductive tracks which are connected to two (or more) terminal blocks associated respectively with the gun 12 and the deflection coils 16.

Electrical connection with the electron multiplier 17 and an electrode of the phosphor screen 14 may be established via the leadthrough 20 using a similar conductor means (not shown) comprising a flexible circuit consisting of polyimide film carrying conductive multiplier and screen electrode. In an alternative arangement, this interconnection may be achieved instead by means of a branch from the conductor means 21.

Following assembly of the tube and evacuation of its envelope, the tube may be operated by mating a connector plug with the external pins of the leadthrough 20 coupled to a suitable source providing appropriate electrical potentials and control voltages for the gun 12, deflection coils 16, electron multiplier 17 and screen electrode.

Referring to FIG. 2, there is shown an example of a so-called "flat-tube". The construction and operation of this tube is described in detail in published British Patent Application No. 2,101,396A, whose disclosure is incorporated herein by reference. For the sake of brevity, the tube will not be described herein in detail. Briefly however, the tube comprises an envelope formed by a front plate glass faceplate 30, a rear wall 31, top and bottom walls 32 and 33, and two side walls, of which only side wall 34 is visible in the figure. Apart from the faceplate, the walls are all formed of mild steel. An electron gun 35 is arranged to produce a low-current, low voltage electron beam which is directed parallel to the faceplate 30 adjacent the rear wall 31.

The beam undergoes line scanning using electrostatic deflector plates 36 and passes through a field-free space produced by electrodes 37 and 38 before being turned through 180° by a reversing lens 39. By means of a series of generally parallel electrodes 40, a varying electric field is produced between the electrodes 40 and the input of a channel plate electron multiplier 41 to achieve frame scanning move the input of the multiplier. The current multiplied beam is accelerated toward a phosphor screen 42 carried on the faceplate 30 by a field established between the output of the multiplier and a screen electrode.

The electron gun 35, deflector plates 36 and electron multiplier 41 are mounted adjacent a central glass-plate partition 43, such mounting not being shown in the schematic representation of FIG. 2 for simplicity. The electrode 37 and frame deflection electrodes 40 are applied directly to opposite surfaces of this partition.

A circular multi-pin leadthrough 45 is mounted in a vacuum-tight manner in the rear wall 31. Conductor means 48 comprising a flexible circuit constituted by polyimide film on which a plurality of conductor tracks are deposited is connected at its one end to the leadthrough 45 and extends downwardly adjacent one side of the envelope around the end of the partition 42 and is connected at its other end to a terminal block 49 mounted on the partition 43. The terminal block is electrically connected by relatively short conductors to the electron gun 35, deflector plates 36, electron multiplier 41 and screen electrode. The screen electrode potential may alternatively be applied via a separate conductor means to avoid any risk of breakdown associated with the high voltage value used (10 KV or more).

A similar flexible circuit (not visible in FIG. 2) is connected between a further multi-pin leadthrough mounted in the rear wall 31 and a terminal block carried on the partition 42, this block being connected to the electrodes 37 and 38, reversing lens 39, and frame deflection electrodes 40. However, more than one additional flexible circuit may be used if desired, each connected between a repsective multi-pin leadthrough and terminal block mounted at any convenient point adjacent the components to be supplied thereby.

Upon connection of the multi-pin leadthrough to a suitable source, electrical potential and control voltages are supplied via the leadthroughs and their associated conductor means and terminals blocks to the internal components of the tube to operate the tube, their operation being described in aforementioned published British Patent Application No. 2101396A.

Figure 3:
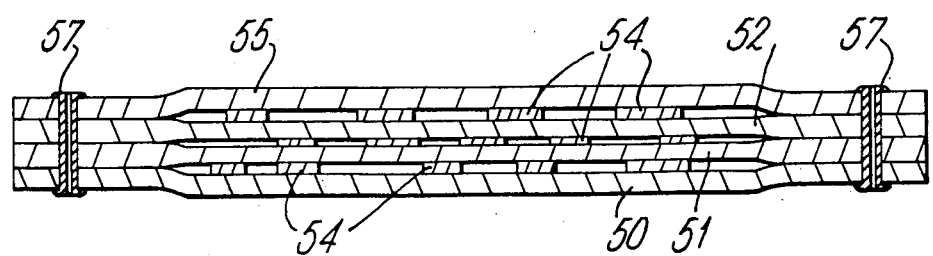
FIG. 3 is a cross-sectional view of one form of conductor means used in the tubes of FIGS. 1 and 2.

Referring now to FIG. 3 there is shown a cross-section through one form of conductor means as used in both the above-described tubes. This particular form of conductor means comprises three elongate layers of polyimide film 50, 51, 52 each carrying a plurality of conductive tracks running along their length, generally designated 54. The layers are superimposed on top of one another in a stack to form a laminate structure with the conductive tracks on two of the films, 50, 51, being covered and protected by the undersurface of the adjacent film, 51, 52, respectively. The conductive tracks 54 on the uppermost film 52 are enclosed and protected by a plain polyimide film 55 uncoated with the conductive traacks, and covering the upper surface of film 52.

Each conductive track-carrying film is fabricated by coating a film of Kapton (Trade Mark) of around 50 to 100 $\mu$m thickness and 3 cms width with a conductive metallic film pattern defining the conductor tracks using conventional evaporation, sputtering, or thick film techniques. Kapton is a polyimide film synthesised by a polycondensation reaction between an aromatic tetrabasic acid and an aromatic amine. The conductor tracks, around 1 to 6 $\mu$m (depending on material) in thickness and 1 to 2 mm width with enlarged ends for connection purposes and spaced apart by around 2 to 3 mm, can be either defined at the conductive film deposition stage of defined later by a photolithographic process. The conductive film is applied directly on the surface of the polyimide film and may comprise nickel, gold, aluminum, copper, or a flexible thick film conductive ink such as a silver organo-metallic ink.

In a preferred method, the polyimide film was preshrunk by baking so as to avoid any problems as a result of the film shrinking when the tube is eventually subjected to a baking operation, and then cut to the appropriate shape and cleaned thoroughly. The desired pattern of tracks was then deposited directly onto the film by thick film screen printing using a silver organo-metallic type thick film conductive ink (Trade Name ESL 9090) which remains flexible when baked. The printed pattern was allowed to settle for 15 minutes and was then dried at 125° C. for 45 minutes. This was followed by baking in a box furnace at 350° C. for 1 hour. The resultant conductive tracks, which have a resistivity of around 150 m cm, were found to be well bonded to the Kapton film, sufficently flexible and did not exhibit any appreciable outgassing during subsequent operations of tube assembly. A silver-based thick film conductive ink such as that available under the Trade Name P110 from Johnson Matthey, which also remains flexible when baked, may be used instead with similar results.

In another method using vacuum deposition tachniques, the flexible circuit was prepared by cleaning a pre-shrunk polyimide film, washing and drying the film, and subjecting the film to a sputter etch to condition the surface. This was followed by depositing a layer of aluminum by radio frequency sputtering to a thickness of around 3 $\mu$m through a mask to define the track pattern.

Using another vacuum deposition technique, the preshrunk, cleaned, washed and dried polyimide film was coated with a layer of aluminum to a thickness of 5 $\mu$m using an electron beam evaporation process. The aluminum was then coated with a dry film resist defining the required track pattern and the unwanted aluminum etched away. The resist material on the remaining aluminum was then removed to leave aluminum tracks directly on the polyimide film. In a modification of this technique, the aluminum was evaporated on the film on the desired pattern using a mechanical mask.

The conductive tracks 54 extend longitudinally of their supporting polyimide film and are shaped and positioned with respect to one another at their ends so as to enable connection with the associated multi-pin leadthrough and terminal block(s).

The layers of the conductor means are fastened together by swaged eyelets 57 passing through their marginal portions at regular intervals along their length. Swaged eyelets may also be used as fasteners at the ends of the conductive means and respective ones of the eyelets are passed through one or more conductive tracks 54 on the film layers so as to connect electrically therewith. The exposed heads of the eyelets are then used as terminals for connection with associated pins of the multi-pin leadthrough and terminal block(s) by spot welding.

It will be appreciated that even with four polyimide film layers, the conductor means still occupies only very little space in one plane and, being thin and flexible can readily be routed around components within the envelope, thus easing assembly. Where branching is required, the four films may be branched at a convenient point along the length of the conductor means, each branch thus having four films, or altenatively individual conductive track-carrying films may be separated where necessary and extend independently of the other films to respective terminal blocks.

Although the conductor means described with reference to FIG. 3 comprises three conductive track-carrying polyimide films, more or fewer films may of course be used depending on the number of separate tracks needed for connection with the electrically-operable internal components of the tube and physical limitations imposed on the film arc size by available space within the tube envelope. for example, if only a few conductive tracks are required and/or available space within the envelope is sufficient to accommodate a comparatively wide film size, only one conductive track-carrying film may be necessary, this being covered by a further polyimide film so as to enclose the conductive tracks.

Although specific forms of cathode ray tubes have been described herein, it will be appreciated that the means for achieving interconnection between a leadthrough in the all of the tube's envelope and internally disposed electrically-operable components and comprising conductor means generally as described above may be employed in other forms of cathode ray tubes where such interconnection is required.

We claim:

1. A cathode ray tube comprising an envelope containing electrically operable components comprising at least means for producing an electron beam within the envelope, electrical leadthrough means extending through the wall of the envelope, and conductor means extending within the envelope and electrically coupled between the leadthrough means and terminals of the electrically operable components characterised in that the conductor means is a flexible circuit comprising at least one film of polyimide on which a plurality of conductive tracks are depsosited.

2. A cathode ray tube according to claim 1, characterized in that the conductive tracks are deposited directly on the polyimide film.

3. A cathode ray tube according to claim 1, characterized in that the conductive tracks at the end of the conductor means remote from the leadthrough means are connected to a common terminal means to which the electrically operable components are coupled.

4. A cathode ray tube according to claim 1, characterized in that the flexible circuit is branched along its length with the end of the conductive track or tracks of each branch being electrically connected to a terminal arrangement associated with the respective branch to which a respective one or more electrically operable components within the envelope is coupled.

5. A cathode ray tube according to claim 1, characterized in that the conductive track-carrying surface of the polyimide film is covered by a further polyimide film so as to enclose the conductive tracks.

6. A cathode ray tube according to claim 1, characterized in that the flexible circuit comprises a plurality of films of polyimide each carrying a plurality of conductive tracks, the plurality of films being stacked together to form a laminate structure with the conductive tracks on one film being covered by an adjacent film.

7. A cathode ray tube according to claim 6, characterized in that the conductive track-carrying surface of the uppermost film is covered by a film of polyimide free of said conductive tracks.

8. A cathode ray tube according to claim 6, characterized in that each conductive track-carrying film is connected at its end remote from the leadthrough means to a respective terminal means.

9. A cathode ray tube according to claim 6, characteriized in that the plurality of polyimide films are secured together by means of fastening elements.

10. A cathode ray tube according to claim 9, characterized in that the fastening elements comprise metal fastening elements which pass through the stacked films.

11. A cathode ray tube according to claim 10, characterized in that metal fastening elements at an end of the conductor means pass through and electrically connect with one or more conductive tracks and serve as terminals for connection with respective termination elements of the leadthrough means and the terminals of the electrically operable components.

* * * * *